United States Patent
Quek et al.

(10) Patent No.: US 6,376,379 B1
(45) Date of Patent: Apr. 23, 2002

(54) METHOD OF HARD MASK PATTERNING

(75) Inventors: Shyue Fong Quek, Petaling Jaya (MY); Ting Cheong Ang, Singapore (SG); Jun Song, Singapore (SG); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/495,344

(22) Filed: Feb. 1, 2000

(51) Int. Cl.⁷ .............................................. H01L 21/302
(52) U.S. Cl. .................... 438/692; 438/712; 438/720; 438/723; 438/717
(58) Field of Search ................................. 438/706, 707, 438/710, 712, 714, 717, 720, 722, 723, 690, 691, 692, 693

(56) References Cited

U.S. PATENT DOCUMENTS

| | | | |
|---|---|---|---|
| 4,288,283 A | * 9/1981 | Umezaki et al. | 156/643 |
| 4,873,163 A | 10/1989 | Watakabe et al. | 430/5 |
| 5,055,158 A | * 10/1991 | Gallagher et al. | 156/643 |
| 5,246,884 A | * 9/1993 | Jaso et al. | 437/225 |
| 5,264,076 A | 11/1993 | Cuthbert et al. | 156/657 |
| 5,382,544 A | 1/1995 | Matsumoto et al. | 437/195 |
| 5,672,243 A | * 9/1997 | Hsia et al. | 216/41 |
| 5,910,021 A | 6/1999 | Tabara | 438/636 |
| 6,200,907 B1 | * 3/2001 | Wang et al. | 438/718 |

* cited by examiner

*Primary Examiner*—Benjamin L. Utech
*Assistant Examiner*—Duy-Vu Deo
(74) *Attorney, Agent, or Firm*—George O. Saile; Rosemary L. S. Pike; Stephen G. Stanton

(57) ABSTRACT

A method of patterning a hard mask, the comprising the following steps. A semiconductor structure is provided. A conductor film is formed over the semiconductor structure. An oxide layer is formed over the conductor film. A patterned metal oxide layer is formed over the conductor film. The oxide layer and the conductor film are etched, using the metal oxide layer as a hard mask, to form a patterned structure.

26 Claims, 3 Drawing Sheets

METHOD OF HARD MASK PATTERNING

FIELD OF THE INVENTION

The present invention relates generally to methods of patterning hard masks used in fabrication of semiconductor devices, and specifically to methods of patterning hard masks formed by UV light exposure.

BACKGROUND OF THE INVENTION

Patterning hard masks are used in the fabrication of semiconductor devices to form metal lines, for example.

U.S. Pat. No. 5,910,021 to Tabara et al. describes a method of manufacturing semiconductor devices having fine patterns. A main conductive layer is formed over a substrate and a conductive antireflection layer (TiN, TiON or CrN) is formed over the main conductive layer. A patterned resist mask is formed over the antireflection layer and the antireflection layer is selectively removed by a first etching gas to form a laminated mask of the resist mask and an antireflection mask self-aligned with the resist mask. The main conductive layer is selectively removed through the laminated mask by a second etching gas different from the first etching gas.

U.S. Pat. No. 5,382,544 to Matsummoto et al. describes a method of manufacturing a semiconductor device by the electron beam exposure method. A resist is applied on an interlayer dielectric (ILD) film through a thin metal (Al, AlSiCu, W, silicide, or preferably Ti) film and a contact hole is formed in the interlayer dielectric film. The thin metal film is used as a part of a second metal wiring pattern after removing its surface oxides.

U.S. Pat. No. 5,264,076 to Cuthbert et al. describes a method of integrated circuit fabrication using a layer of spin-on-glass (SOG) as a hard mask for patterning an underlying layer of polysilicon to form gate structures or the like.

U.S. Pat. No. 4,873,163 to Watakaabe et al. describes a photomask material blank, and a method of manufacturing same. The photomask material comprises a transparent substrate and a silicide film of a transition metal formed on the substrate. The metal silicide may be comprised of molybdenum (Mo), tungsten (W), or tantalum (Ta). In an alternate embodiment, a low reflective film comprised of $MoO_2$, $WO_2$, $TiO_2$, or CrO is formed over a silicide film, e.g. a $MoO_2$ film may be formed over a Mo silicide film.

SUMMARY OF THE INVENTION

Accordingly, it is an object of the present invention to provide an improved method of forming hard masks used in fabrication of semiconductor devices.

Other objects will appear hereinafter.

It has now been discovered that the above and other objects of the present invention may be accomplished in the following manner. Specifically, a semiconductor structure is provided. A conductor film is formed over the semiconductor structure. An oxide layer is formed over the conductor film. A patterned metal oxide layer is formed over the conductor film. The oxide layer and the conductor film are etched, using the metal oxide layer as a hard mask, to form a patterned structure.

BRIEF DESCRIPTION OF THE DRAWINGS

The features and advantages of the improved method of forming hard masks used in fabrication of semiconductor devices according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
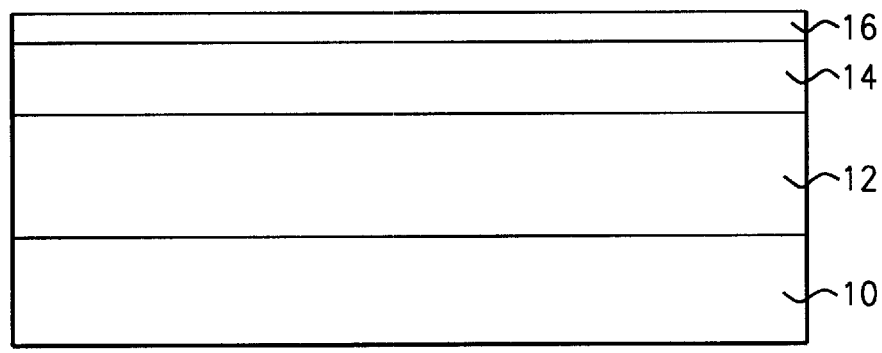
FIGS. 1, 2, 3, 4, 5A, 5B, and 5C schematically illustrates in cross-sectional representation a preferred embodiment of the present invention.

Accordingly, as shown in FIG. 1 starting semiconductor structure 10 can represent a substrate or a substrate having overlying devices, conducting and insulating layers. Preferably the structure has a top insulating layer upon which the conductor film 12 is formed. The insulating layer can be an interlevel dielectric (ILD) layer or an intermetal dielectric (IMD) layer. Unless otherwise specified, all structures, layers, etc. may be formed or accomplished by conventional methods known in the prior art.

Conductor film 12 is formed over semiconductor structure 10 to a thickness of from about 2000 to 5000 Å, more preferably from about 3000 to 4000 Å, and most preferably from about 3300 to 3700 Å. Conductor film 12 may be comprised of aluminum (Al), an aluminum copper alloy (AlCu), copper (Cu), or polysilicon and is preferably a multi-layer conductor film. Multi-layer conductor film 12 may be comprised of, for example: a layer of TiN over a layer of Al or AlCu; a layer of TaN over a layer of Cu; or a layer of tungsten (W) or tungsten silicide ($WSi_x$) over a layer of polysilicon.

Layer 14 is then formed over conductor layer 12 to a thickness of from about 200 to 500 Å, more preferably from about 300 to 400 Å, and most preferably from about 330 to 370 Å. Layer 14 may be comprised of $Si_xN_y$, polyimide, a low-K dielectric material (both organic and inorganic), and is preferably silicon oxide (oxide). For purposes of example, silicon oxide (oxide) will be used for layer 14 hereafter.

Metal layer 16 is deposited over oxide layer 14 to a thickness from about 100 to 500 Å, more preferably from about 200 to 400 Å, and most preferably from about 250 to 350 Å. Metal layer 16 may be comprised of Al, Ta, W, Cu or a multi-layer of Al over Cu and is preferably comprised of titanium (Ti). For purposes of example, Ti will be used for metal layer 16 hereafter.

Figure 2:
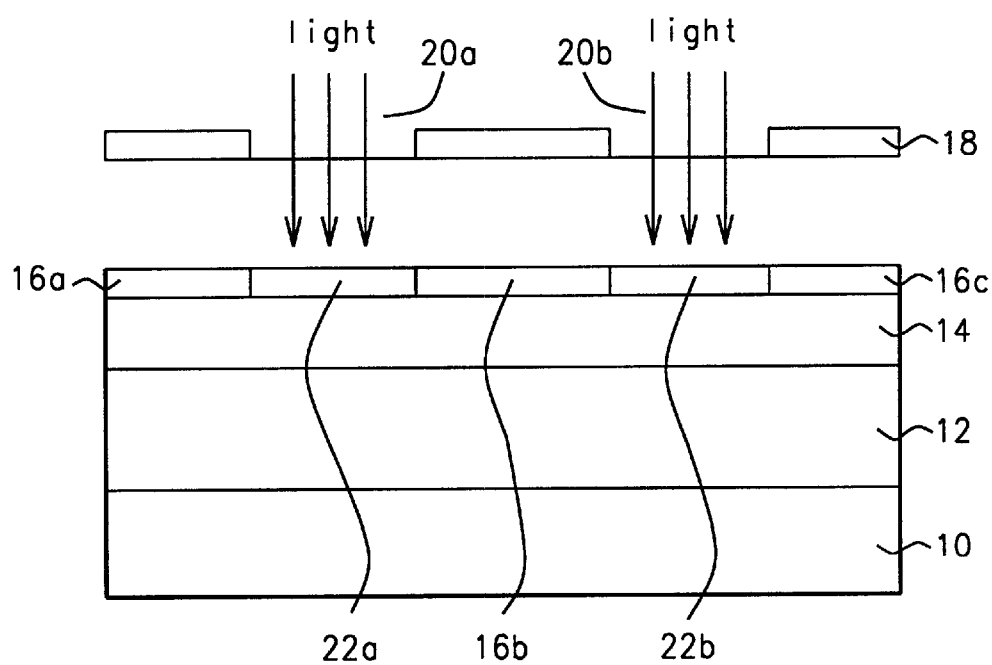

As shown in FIG. 2, a reverse optical mask 18, having apertures 20a, 20b, is used to pattern Ti metal layer 16 forming metal oxide, e.g. $TiO_2$, portions 22a, 22b, respectively, having a thickness from about 100 to 600 Å thick, more preferably from about 200 to 500 Å thick, and most preferably from about 250 to 400 Å thick. This is preferably accomplished by:

a) exposing Ti metal layer 16 with either DUV (deep ultraviolet) light having a wavelength from about 180 to 250 nm for ambient oxygen ($O_2$); or (b) I line light having a wavelength from about 250 to 450 nm for ambient ozone ($O_3$) through apertures 20a, 20b of mask. The process may be performed under the following parameters: about 100° C. temperature or higher; a laser raster or vector scan tool with the specified wavelength; and a nitrogen or inert gas with a low vacuum ambient preferred.

Alternately, $TiO_2$ portions 22a, 22b may be formed by oxidizing Ti metal layer 16 in a high temperature oxygen ambient, or anodizing.

These processes can be carried up in a laser raster tool manufactured by the Verdent or Ultratech companies, or a vector scan tool manufactured by the Nikon or ASML companies, for example. Several other companies' tools may also be used as is known in the prior art.

Although two apertures 20a, 20b are illustrated to form two metal oxide portions 22a, 22b, more or less apertures may be used to form more or less metal oxide portions, respectively.

The UV radiation causes the breakdown of either $O_3$ or $O_2$ into oxygen radicals based upon the wavelength used. As an example:

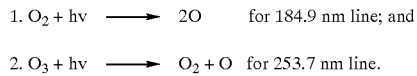

The $UVO_3$ process of the present invention permits formation of $TiO_2$ hard mask portions 22a, 22b. In the present invention, the following reactions occur:

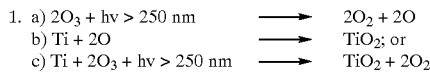

with an $O_3$ flow between about 100 and 10,000 sccm; or

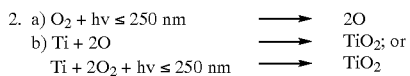

with an $O_2$ flow between about 100 and 10,000 sccm. to form $TiO_2$ hard mask portions 22a, 22b at a temperature from about 25 to 800° C. for a period of from about 1 second to about 600 minutes.

Remaining portions of Ti layer 16a, 16b, 16c are stripped by, for example peroxide, to leave $TiO_2$ hard mask portions 22a, 22b over oxide layer 14.

Figure 3:
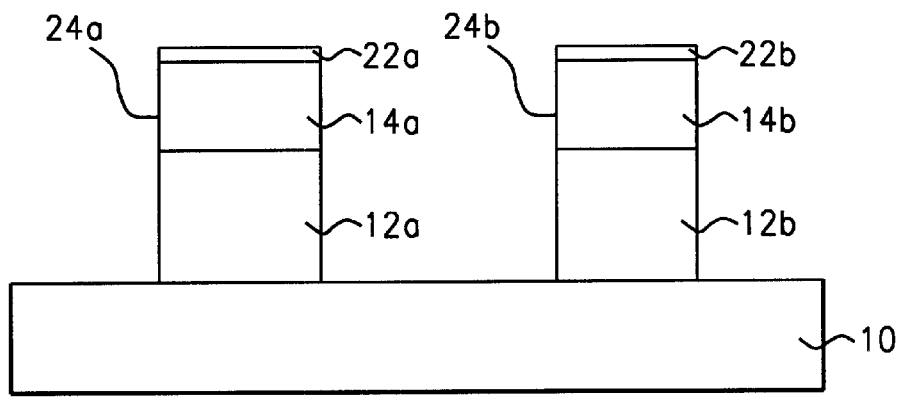

As shown in FIG. 3, oxide layer 14 an d conductor layer 12 are etched using $TiO_2$ hard mask portions 22a, 22b to form patterned structures 24a, 24b having portions 22a, 22b; 14a, 14b; 12a, 12b, respectively. Patterned structures 24a, 24b may have equal widths or differing widths such as shown in FIG. 3 where patterned structure 24a is wider than patterned structure 24b, for example. This permits formation of the predetermined underlying structures, such as metal lines, for example, having differing widths.

Figure 4:
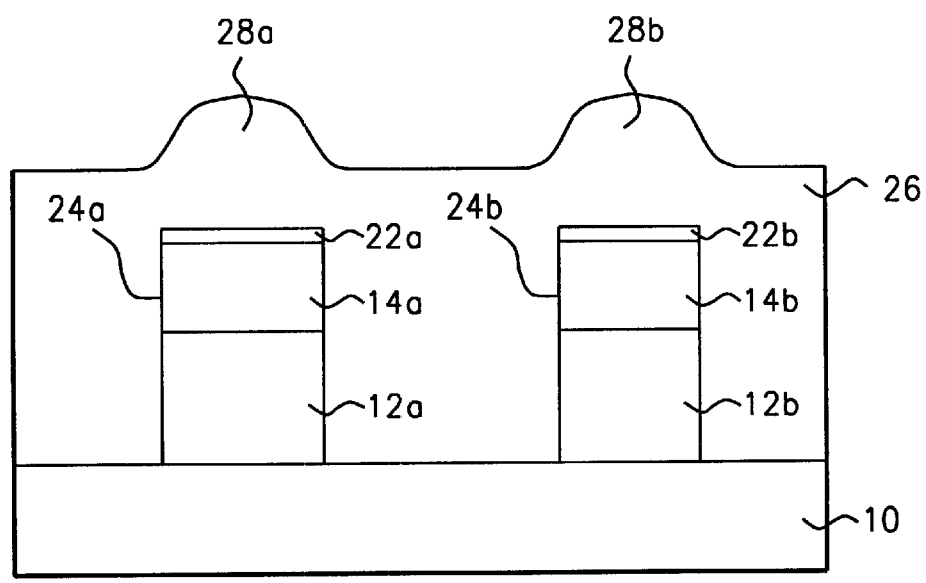

As shown in FIG. 4, dielectric layer 26 is formed over the structure at least high enough to cover patterned structures 24a, 24b. Dielectric layer 26 has protrusions 28a, 28b conforming to the underlying topography, that is hard masks 24a, 24b. Dielectric layer 26 may be formed of silicon dioxide, silicon nitride, silicon oxynitride, FSG (fluorinated silicate glass), (BPSG) boro-phosphosilicate glass, or PSG (phosphosilicate glass) depending upon the application requirements.

Figure 5A:
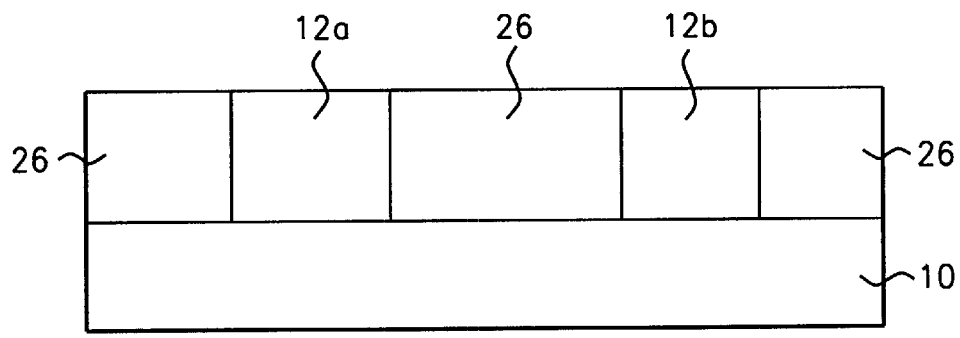
Figure 5B:
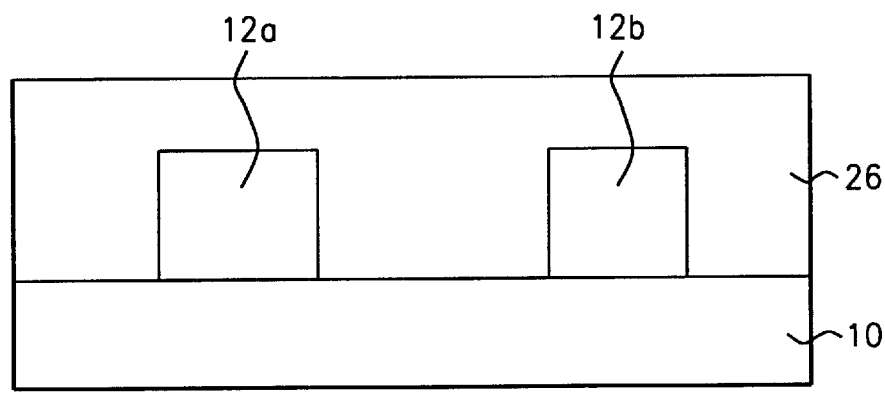
Figure 5C:
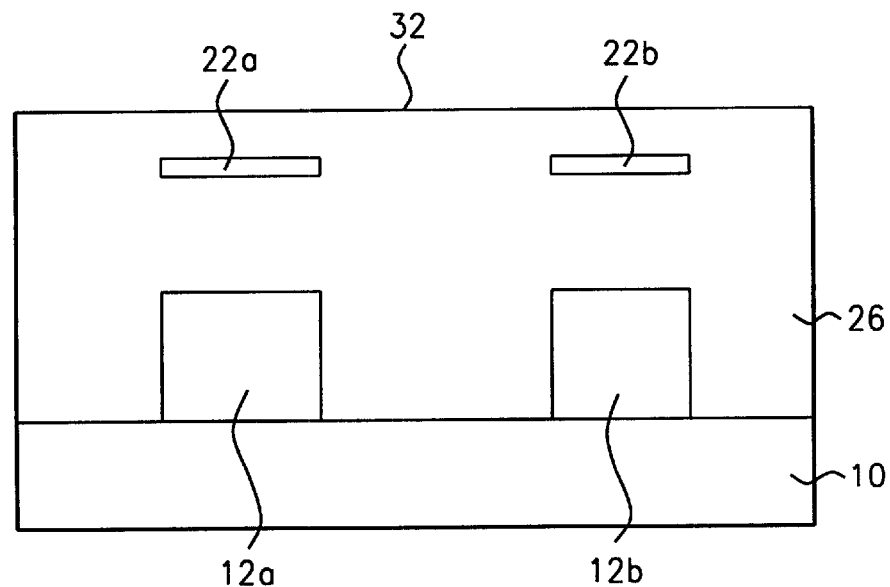

As shown in FIGS. 5a, 5b, and 5c, dielectric layer 26, inter alia, is planarized, or polished, by, for example, chemical mechanical polishing (CMP) to remove protrusions 28a, 28b forming three alternate structures, respectively.

First, Preferred Structure

As shown in FIG. 5a, the CMP may polish dielectric layer 26 of FIG. 4 to a level essentially equal to the top of conductor layer portions, or metal lines e.g., 12a, 12b, removing hard mask portions 22a, 22b and oxide layer portions 14a, 14b. The structure of 5a is used in metal patterning for interconnects.

Second Structure

As shown in FIG. 5b, the CMP may polish dielectric layer 26 of FIG. 4 to a level essentially equal to, or below, the top of oxide layer 14, removing hard mask portions 22a, 22b. The structure of FIG. 5b is used to: form a Damascene type of interconnects on top of conductor film portions 12a, 12b; and illustrates a method of forming metal lines and interlevel dielectric (interconnect integration scheme).

Third Structure

As shown in FIG. 5c, the CMP may polish dielectric layer 26 at least to remove protrusions 28a, 28b and form planarized surface 32 of dielectric layer 26 that is above hard mask portions 22a, 22b from about 100 to 10,000 Å, and more preferably from about 100 to 1000 Å. The structure of FIG. 5c illustrates a method to: form etch-stop layers (22a, 22b) embedded in interlevel dielectric (may be used for Damascene etch-stop applications, etc.); and form high-k capacitors (22a, 22b as high-k dielectric).

While particular embodiments of the present invention have been illustrated and described, it is not intended to limit the invention, except as defined by the following claims.

We claim:

1. A method of patterning a hard mask, the steps comprising:

providing a semiconductor structure;

forming a conductor film over said semiconductor structure;

forming an oxide layer over said conductor film;

forming a patterned metal oxide layer over said conductor film; said patterned metal oxide layer is a hard mask;

etching said oxide layer and said conductor film using said metal oxide layer as a hard mask to form a patterned structure;

depositing a layer of dielectric material over said oxide hard masks; and planarizing said dielectric material and said patterned structures to form a planarized dielectric layer and a planarized patterned oxide layer, whereby at least said patterned metal oxide layer is removed by said planarization.

2. The method of claim 1, wherein said conductor film is comprised of a material selected from the group consisting of: aluminum, an aluminum copper alloy, copper, polysilicon, TiN/Al multilayer stack, TiN/AlCu multilayer stack, TaN/Cu multilayer stack, W/polysilicon multilayer stack, and $WSi_x$/polysilicon multilayer stack; said oxide layer is comprised of a material selected from the group consisting of: silicon oxide, $Si_xN_y$, polyimide, and low-k dielectric materials (both organic and inorganic); said patterned metal oxide layer is comprised of a material selected from the group comprising: $TiO_2$, $AL_2O_3$, $Ta_2O_5$, $W_xO_y$, and $Cu_xO_y$.

3. The method of claim 1, wherein said conductor film is from about 2000 to 5000 Å thick; said oxide layer is from about 200 to 500 Å thick; and said patterned metal oxide layer is from about 100 to 600 Å thick.

4. The method of claim 1, wherein said conductor film is from about 3300 to 3700 Å thick; said oxide layer is from about 330 to 370 Å thick; and said patterned metal oxide layer is from about 200 to 500 Å thick.

5. The method of claim 1, wherein said patterned metal oxide layer is formed by $UVO_3$ oxidation performed at a temperature from about 25 to 800° C. for about 1 second to 600 minutes.

6. The method of claim 1, wherein said patterned metal oxide layer formation includes the steps of:

forming a metal layer over said oxide layer; and selectively exposing said metal layer to $UVO_3$ radiation to form said patterned metal oxide layer.

7. The method of claim 1, wherein said patterned metal oxide layer formation includes the steps of:

forming a metal layer having a thickness from about 100 to 500 Å over said oxide layer; and selectively exposing said metal layer to $UVO_3$ radiation to form said patterned metal oxide layer;

wherein said $UVO_3$ oxidation is performed at a temperature from about 25 to 800° C. for about 1 second to 600 minutes.

8. The method of claim 1, including the steps of:

depositing a layer of dielectric material over said patterned structures, at least covering said patterned metal oxide layer; and planarizing said dielectric material to a first thickness.

9. The method of claim 1, including the steps of:

depositing a layer of dielectric material over said oxide hard masks, at least covering said oxide hard masks; and planarizing said dielectric material to form a planarized dielectric layer above the top of said patterned metal oxide layer.

10. The method of claim 1, wherein said planarizing of said dielectric material and said patterned structures also forms a planarized patterned conductor film, whereby at least said patterned oxide layer is also removed by said planarization.

11. A method of patterning a hard mask, the steps comprising:

providing a semiconductor structure;

forming a conductor film over said semiconductor structure; said conductor film being comprised of a material selected from the group consisting of: aluminum, an aluminum copper alloy, copper, polysilicon, TiN/Al multilayer stack, TiN/AlCu multilayer stack, TaN/Cu multilayer stack, W/polysilicon multilayer stack, and $WSi_x$/polysilicon multilayer stack;

forming an oxide layer over said conductor film; said oxide layer being comprised of a material selected from the group consisting of: silicon oxide, $Si_xN_y$, polyimide, and low-k dielectric materials (both organic and inorganic);

forming a patterned metal oxide layer over said conductor film; said patterned metal oxide layer being comprised of a material selected from the group consisting of: $TiO_2$, $AL_2O_3$, $Ta_2O_5$, $W_xO_y$, and $Cu_xO_y$;

etching said oxide layer and said conductor film using said metal oxide layer as a hard mask to form a patterned structure depositing a layer of dielectric material over said oxide hard masks; and planarizing said dielectric material and said patterned structures to form a planarized dielectric layer and a planarized patterned oxide layer, whereby at least said patterned metal oxide layer is removed by said planarization.

12. The method of claim 11, wherein said conductor film is from about 2000 to 5000 Å thick; said oxide layer is from about 200 to 500 Å thick; and said patterned metal oxide layer is from about 100 to 600 Å thick.

13. The method of claim 11, wherein said conductor film is from about 3300 to 3700 Å thick; said oxide layer is from about 330 to 370 Å thick; and said patterned metal oxide layer is from about 200 to 500 Å thick.

14. The method of claim 11, wherein said patterned metal oxide layer is formed by $UVO_3$ oxidation performed at a temperature from about 25 to 800° C. for about 1 second to 600 minutes.

15. The method of claim 11, wherein said patterned metal oxide layer formation includes the steps of:

forming a metal layer over said oxide layer; and selectively exposing said metal layer to $UVO_3$ radiation to form said patterned metal oxide layer.

16. The method of claim 11, wherein said patterned metal oxide layer formation includes the steps of:

forming a metal layer having a thickness from about 100 to 500 Å over said oxide layer; and selectively exposing said metal layer to $UVO_3$ radiation to form said patterned metal oxide layer;

wherein said $UVO_3$ oxidation is performed at a temperature from about 25 to 800° C. for about 1 second to 600 minutes.

17. The method of claim 11, including the steps of:

depositing a layer of dielectric material over said patterned structures, at least covering said patterned metal oxide layer; and planarizing said dielectric material to a first thickness.

18. The method of claim 11, including the steps of:

depositing a layer of dielectric material over said oxide hard masks, at least covering said oxide hard masks; and planarizing said dielectric material to form a planarized dielectric layer above the top of said patterned metal oxide layer.

19. The method of claim 11, wherein said planarizing of said dielectric material and said patterned structures also forms a planarized patterned conductor film, whereby at least said patterned oxide layer is also removed by said planarization.

20. A method of patterning a hard mask, the steps comprising:

providing a semiconductor structure;

forming a conductor film over said semiconductor structure; said conductor film being comprised of a material selected from the group consisting of: aluminum, an aluminum copper alloy, copper, polysilicon, TiN/Al multilayer stack, TiN/AlCu multilayer stack, TaN/Cu multilayer stack, W/polysilicon multilayer stack, and $WSi_x$/polysilicon multilayer stack;

forming an oxide layer over said conductor film; said oxide layer being comprised of a material selected from the group consisting of: silicon oxide, $Si_xN_y$, polyimide, and low-k dielectric materials (both organic and inorganic);

forming a metal layer over said oxide layer; said metal layer being comprised of a material selected from the group consisting of: Ti, Al, Ta, W, Cu, and a multilayer stack of Al over Cu;

selectively exposing said metal layer to $UVO_3$ radiation to form a patterned metal oxide layer;

etching said oxide layer and said conductor film using said metal oxide layer as a hard mask to form a patterned structure;

depositing a layer of dielectric material over said oxide hard masks; and planarizing said dielectric material and said patterned structures to form a planarized dielectric layer and a planarized patterned oxide layer, whereby at least said patterned metal oxide layer is removed by said planarization.

21. The method of claim 20, wherein said conductor film is from about 2000 to 5000 Å thick; said oxide layer is from about 200 to 500 Å thick; said patterned metal oxide layer is from about 100 to 600 Å thick; and said metal layer is from about 100 to 500 Å thick.

22. The method of claim 20, wherein said conductor film is from about 3300 to 3700 Å thick; said oxide layer is from about 330 to 370 Å thick; said patterned metal oxide layer is from about 200 to 500 Å thick; and said metal layer is from about 250 to 350 Å thick.

23. The method of claim 20, wherein said UVO3 radiation is performed at a temperature from about 25 to 800° C. for about 1 second to 600 minutes.

24. The method of claim 20, including the steps of:

depositing a layer of dielectric material over said patterned structures, at least covering said patterned metal oxide layer; and planarizing said dielectric material to a first thickness.

25. The method of claim 20, including the steps of:

depositing a layer of dielectric material over said oxide hard masks, at least covering said oxide hard masks; and planarizing said dielectric material to form a planarized dielectric layer above the top of said patterned metal oxide layer.

26. The method of claim 20, wherein said planarizing of said dielectric material and said patterned structures also forms a planarized patterned conductor film, whereby at least said patterned oxide layer is also removed by said planarization.

* * * * *